(12) United States Patent
Tempel et al.

(10) Patent No.: US 8,940,603 B2
(45) Date of Patent: Jan. 27, 2015

(54) METHOD OF MAKING SEMICONDUCTOR DEVICE

(75) Inventors: Georg Tempel, Dresden (DE); Ernst-Otto Andersen, Moritzburg (DE); Achim Gratz, Dresden (DE)

(73) Assignee: Infineon Technologies AG, Neubiberg (DE)

(*) Notice: Subject to any disclaimer, the term of this patent is extended or adjusted under 35 U.S.C. 154(b) by 20 days.

(21) Appl. No.: 13/554,971

(22) Filed: Jul. 20, 2012

(65) Prior Publication Data

US 2012/0289010 A1 Nov. 15, 2012

Related U.S. Application Data

(62) Division of application No. 11/779,776, filed on Jul. 18, 2007, now Pat. No. 8,247,861.

(51) Int. Cl.
| | |
|---|---|
| H01L 21/336 | (2006.01) |
| H01L 21/28 | (2006.01) |
| H01L 49/02 | (2006.01) |
| H01L 29/423 | (2006.01) |
| H01L 29/49 | (2006.01) |
| H01L 29/66 | (2006.01) |
| H01L 29/788 | (2006.01) |

(52) U.S. Cl.
CPC .......... *H01L 21/28273* (2013.01); *H01L 28/60* (2013.01); *H01L 29/42324* (2013.01); *H01L 29/495* (2013.01); *H01L 29/66825* (2013.01); *H01L 29/7881* (2013.01)
USPC .......................................... 438/257; 438/593

(58) Field of Classification Search
CPC ............ H01L 29/66825; H01L 29/788; H01L 27/11582; H01L 29/7889; H01L 27/11517
USPC ................ 438/201, 211, 257, 266, 593, 597; 257/119, 214, 315–326
See application file for complete search history.

(56) References Cited

U.S. PATENT DOCUMENTS

| | | | | |
|---|---|---|---|---|
| 5,013,674 | A | * | 5/1991 | Bergemont ................... 438/201 |
| 5,303,187 | A | * | 4/1994 | Yu ............................ 365/185.14 |
| 5,432,739 | A | | 7/1995 | Pein |
| 5,448,091 | A | * | 9/1995 | Bryant et al. .................. 257/315 |
| 5,480,820 | A | * | 1/1996 | Roth et al. ..................... 438/257 |
| 5,768,186 | A | | 6/1998 | Ma |
| 5,879,990 | A | * | 3/1999 | Dormans et al. ............... 438/257 |
| 5,903,494 | A | * | 5/1999 | Papadas et al. ........... 365/185.01 |
| 5,973,354 | A | | 10/1999 | Chang |
| 5,986,941 | A | * | 11/1999 | Pang et al. ................ 365/185.33 |

(Continued)

FOREIGN PATENT DOCUMENTS

EP 1 895 594 A2 3/2008

OTHER PUBLICATIONS

Lee, et al., "High-Density Single-Poly Electrically Erasable Programmable Logic Device for Embedded Nonvolatile Memory Applications," Japanese Journal of Applied Physics, vol. 44, No. 1A., 2005, pp. 44-49.

*Primary Examiner* — Cuong Q Nguyen
*Assistant Examiner* — Yosef Gebreyesus
(74) *Attorney, Agent, or Firm* — Slater & Matsil, L.L.P.

(57) ABSTRACT

A semiconductor device and method of making a semiconductor device are disclosed. A semiconductor body, a floating gate poly and a source/drain region are provided. A metal interconnect region with a control gate node is provided that capacitively couples to the floating gate poly.

7 Claims, 17 Drawing Sheets

(56) References Cited

U.S. PATENT DOCUMENTS

| | | | |
|---|---|---|---|
| 6,103,575 A * | 8/2000 | Chang | 438/257 |
| 6,117,732 A | 9/2000 | Chu et al. | |
| 6,465,833 B1 * | 10/2002 | Jung et al. | 257/314 |
| 6,509,606 B1 * | 1/2003 | Merrill et al. | 257/321 |
| 6,528,842 B1 | 3/2003 | Luich et al. | |
| 6,617,637 B1 | 9/2003 | Hsu et al. | |
| 6,806,529 B1 | 10/2004 | Hopper et al. | |
| 6,818,936 B2 | 11/2004 | Lin et al. | |
| 6,864,526 B2 | 3/2005 | Inbe | |
| 6,920,067 B2 | 7/2005 | Hsu et al. | |
| 6,940,119 B2 * | 9/2005 | Dray et al. | 257/314 |
| 7,037,845 B2 | 5/2006 | Brask et al. | |
| 7,256,443 B2 * | 8/2007 | Miida | 257/314 |
| 2002/0063337 A1 | 5/2002 | Oizumi et al. | |
| 2003/0052359 A1 | 3/2003 | Shin et al. | |
| 2004/0206996 A1 | 10/2004 | Lee et al. | |
| 2005/0280061 A1 | 12/2005 | Lee | |
| 2006/0134862 A1 | 6/2006 | Parris et al. | |
| 2006/0202256 A1 | 9/2006 | Harari | |
| 2006/0244041 A1 | 11/2006 | Tanaka et al. | |
| 2006/0270137 A1 * | 11/2006 | Chen et al. | 438/201 |
| 2006/0275962 A1 | 12/2006 | Lee | |
| 2007/0241384 A1 | 10/2007 | Zhu | |
| 2008/0054331 A1 | 3/2008 | Chen et al. | |
| 2008/0074180 A1 * | 3/2008 | Watanabe et al. | 327/566 |
| 2008/0083942 A1 | 4/2008 | Terzioglu et al. | |
| 2008/0186773 A1 | 8/2008 | Bergemont et al. | |
| 2008/0239821 A1 * | 10/2008 | Mokhlesi | 365/185.17 |

* cited by examiner

METHOD OF MAKING SEMICONDUCTOR DEVICE

RELATED APPLICATIONS

This is a divisional application of U.S. application Ser. No. 11/779,776, which was filed on Jul. 18, 2007 entitled, "Semiconductor Device and Method of Making Same" and is incorporated herein by reference.

TECHNICAL FIELD

An embodiment of the present invention relates generally to the manufacture of semiconductor devices, and more particularly to structures and methods of manufacturing floating gate memory devices.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0." Memory devices may be static or dynamic. Dynamic memory devices need to be refreshed to "remember" the data, whereas static memory devices do not need to be refreshed to retain stored data.

One type of static memory device, also referred to in the art as a non-volatile memory (NVM) device, is a floating gate memory device. Floating gate memory devices can be either erasable programmable read-only memory (EPROM) or electrically erasable programmable read-only memory (EEPROM). Both of these floating gate memories rely on trapping charge in the floating gate by suitable application of a bias to the various terminals of the device. The charge may be trapped by a number of mechanisms comprising carrier tunneling and/or injection. The charge may be removed either electrically as in EEPROM devices or by an external source such as an ultra violet light. The presence of this charge in the floating gate determines the state of the memory as "1" or "0". The floating gate devices are usually arranged in large arrays to form a memory device such as a Flash memory. Based on the layout of the floating gate transistors, Flash memories may comprise a NOR, NAND, or an AND memory cell. As an example, most commercial memory cards such as memory sticks comprise NAND Flash cells.

Floating gate devices are increasingly used in combination with other CMOS devices and components. A typical floating gate device comprises a double poly stack separated by an insulator, wherein the lower poly forms the floating gate and the upper poly forms the control gate. Such floating gate devices fabricated using a CMOS process flow requires additional processing such as additional mask levels. For example, although the process for forming the control gate poly and logic gate poly can be shared or common with the CMOS devices, forming the floating gate poly requires additional process steps (for example, deposit, pattern and etch). The number of lithography or masking steps correlates to the cost of a process flow. In fact, Flash memory devices typically take about 1.5 times to about 2.5 times more lithography steps than standard CMOS devices. Such a process flow may not be cost efficient, in some cases. For example, if non volatile memories comprise only a small portion of the wafer area, the additional process steps may increase the wafer cost considerably. In some cases, for example, it may not be cost effective to add extra process steps, if the fraction of the memory devices is less than 10% of the total number of devices. Similarly, the total number of memory devices in a memory array may dictate the cost effectiveness of introducing additional process steps. For example, if the memory array has less than 100 devices, it may not be effective to add extra process steps.

Thus, what are needed in the art are cost effective ways of forming CMOS compatible floating gate devices especially when the ratio of memory to logic device is low.

SUMMARY OF THE INVENTION

In one embodiment of the present invention, a semiconductor device includes a single poly floating gate memory device processed in a standard CMOS flow. The control gate is formed along with the back end interconnects and uses the interconnect capacitance to couple to the poly floating gate electrode.

The foregoing has outlined rather broadly the features of an embodiment of the present invention. Additional features of embodiment of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of an embodiment of the present invention. It should also be realized by those skilled in the art that such equivalent constructions do not depart from the spirit and scope of an embodiment of the invention as set forth in the appended claims.

BRIEF DESCRIPTION OF THE DRAWINGS

For a more complete understanding of embodiments of the present invention, and the advantages thereof, reference is now made to the following descriptions taken in conjunction with the accompanying drawings, in which:

FIG. 1, which includes

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a structure and method for forming a floating gate structure compatible with standard CMOS flow. An embodiment of the invention avoids the deposition and patterning of separate second poly to form a control gate as is typically done in a double poly process. Instead, the metallization levels are used to couple the floating gate and control gate of the floating gate device. Although explained in a particular embodiment, as will be evident, concepts of the invention can be applied, however, to other methods, devices and cells. For example, the current invention is applicable to any floating gate memory cell independent of circuit or device design. Hence the programming device can be used in either programmable read only memories (EPROM), electrically erasable and programmable read only memories (EEPROM) and/or Flash memories.

In preferred embodiments, the present invention provides a method for making a floating gate memory semiconductor device in a standard CMOS process flow. Further, the invention provides a method of forming these devices without using any extra mask levels relative to the logic devices. Hence, the described flow can be implemented in any CMOS process flow such as foundry process with minimal changes. Consequently, an embodiment of the invention may be implemented in memory devices that include other circuitry such as high voltage devices, logic devices, input/output devices, row and column decoders, sense amplifiers, and other circuitry, as examples.

Figure 5A:
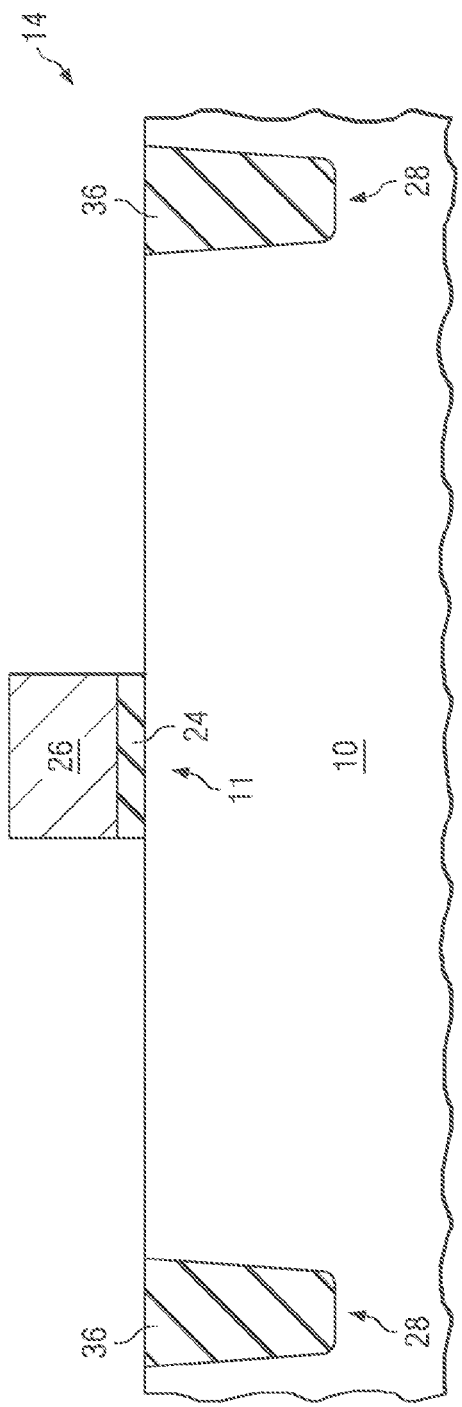
FIGS. 5a-5e illustrate cross-sectional views of a first embodiment process.
Figure 5B:
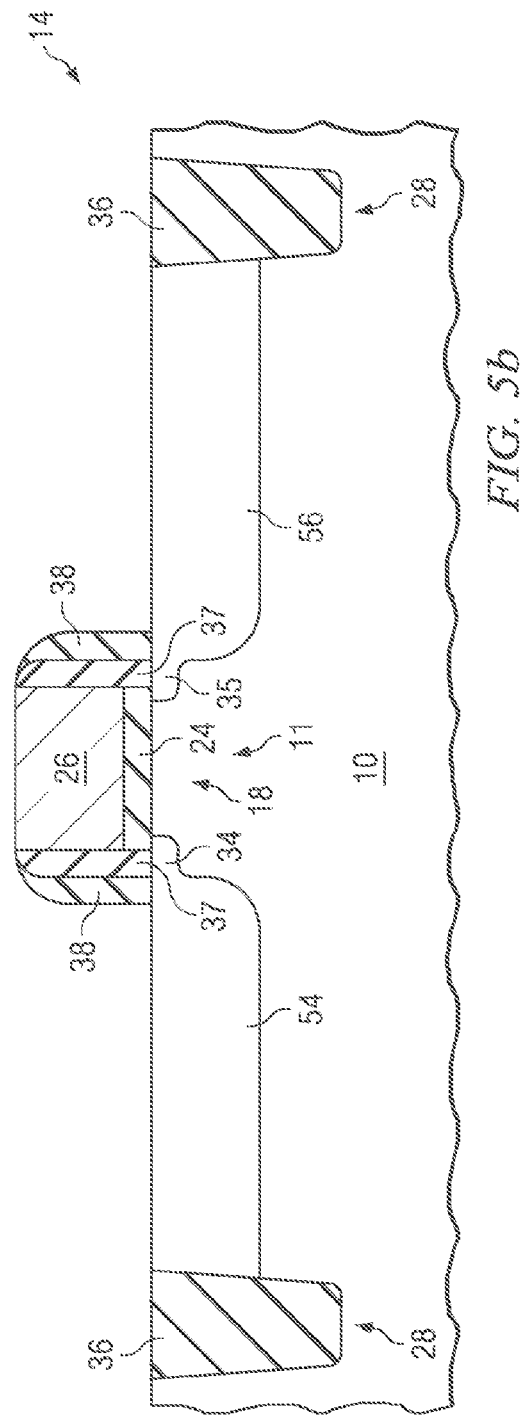
Figure 5C:
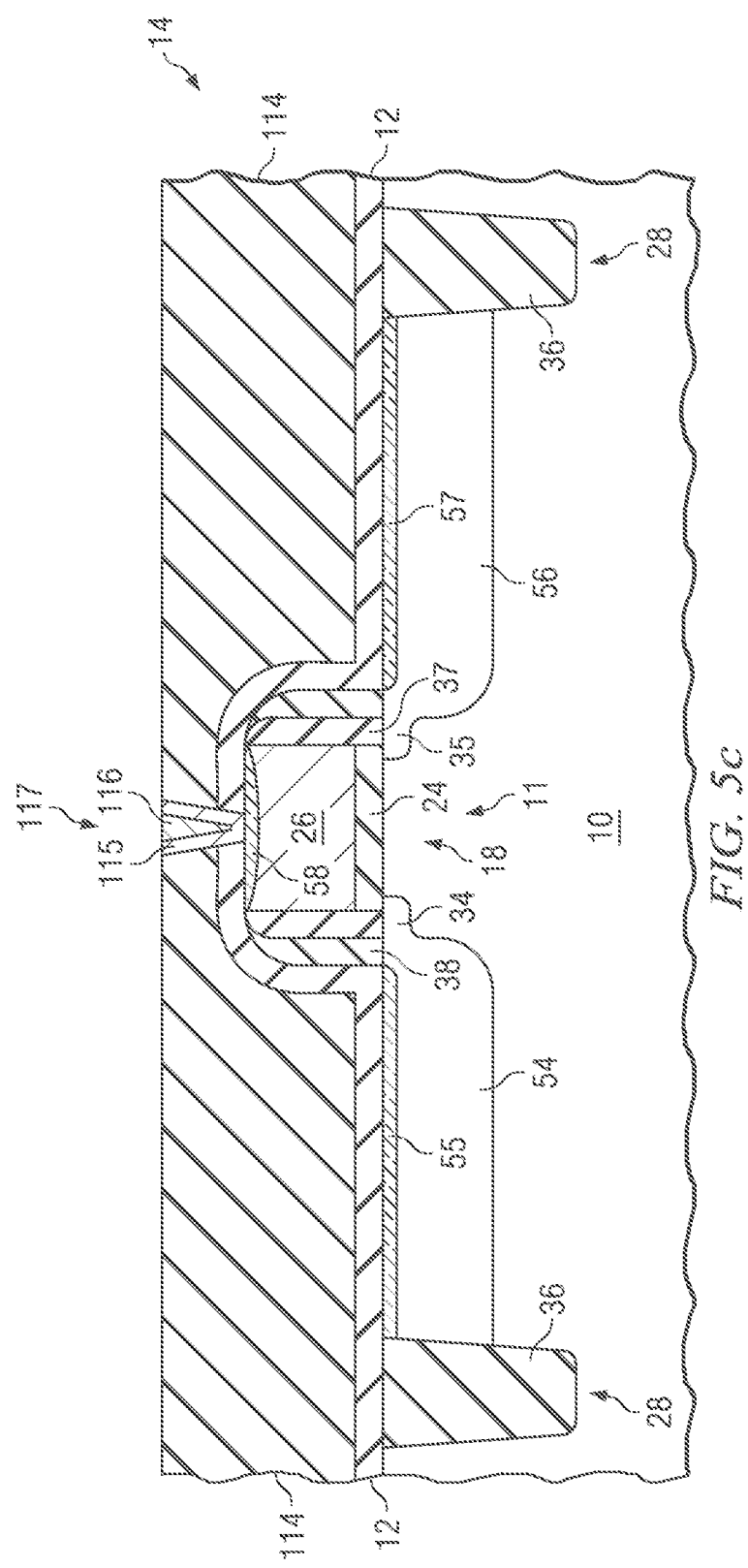
Figure 5D:
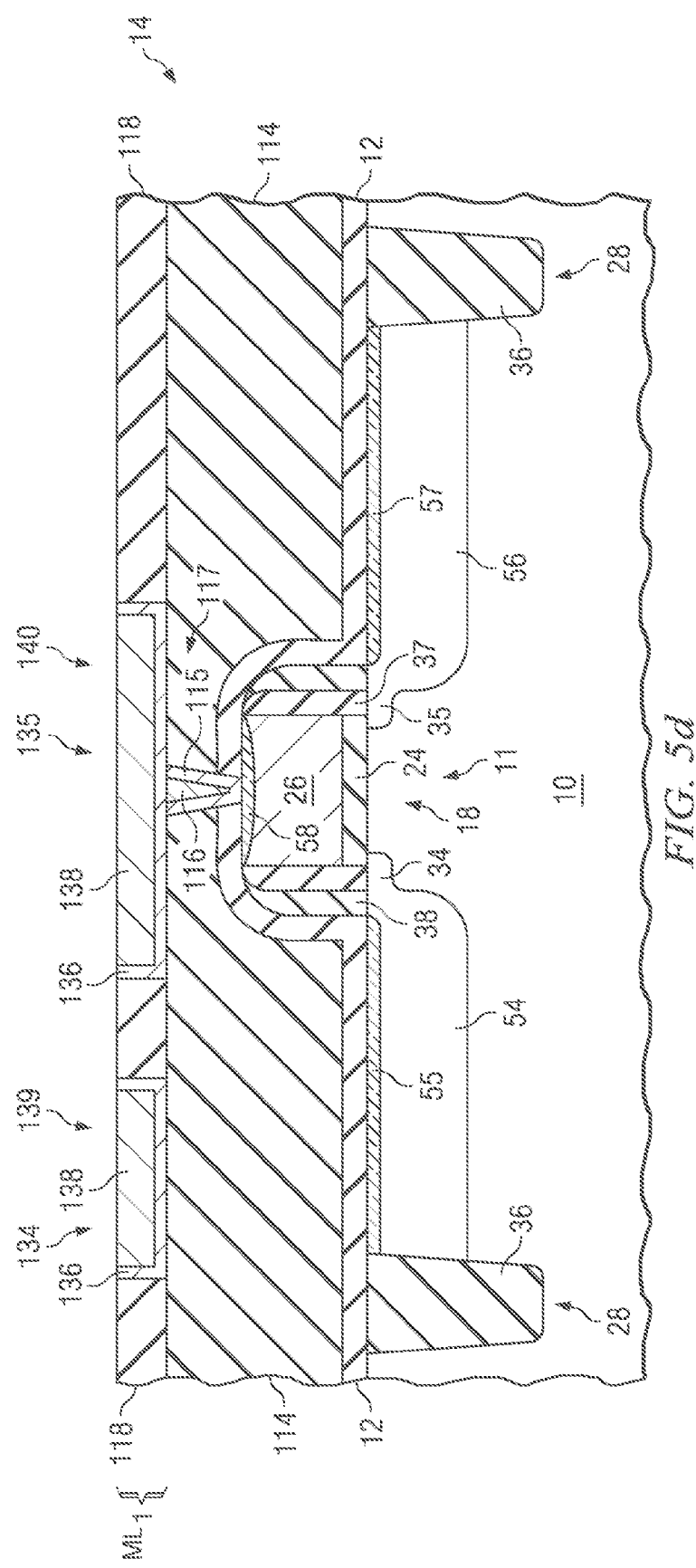
Figure 5E:
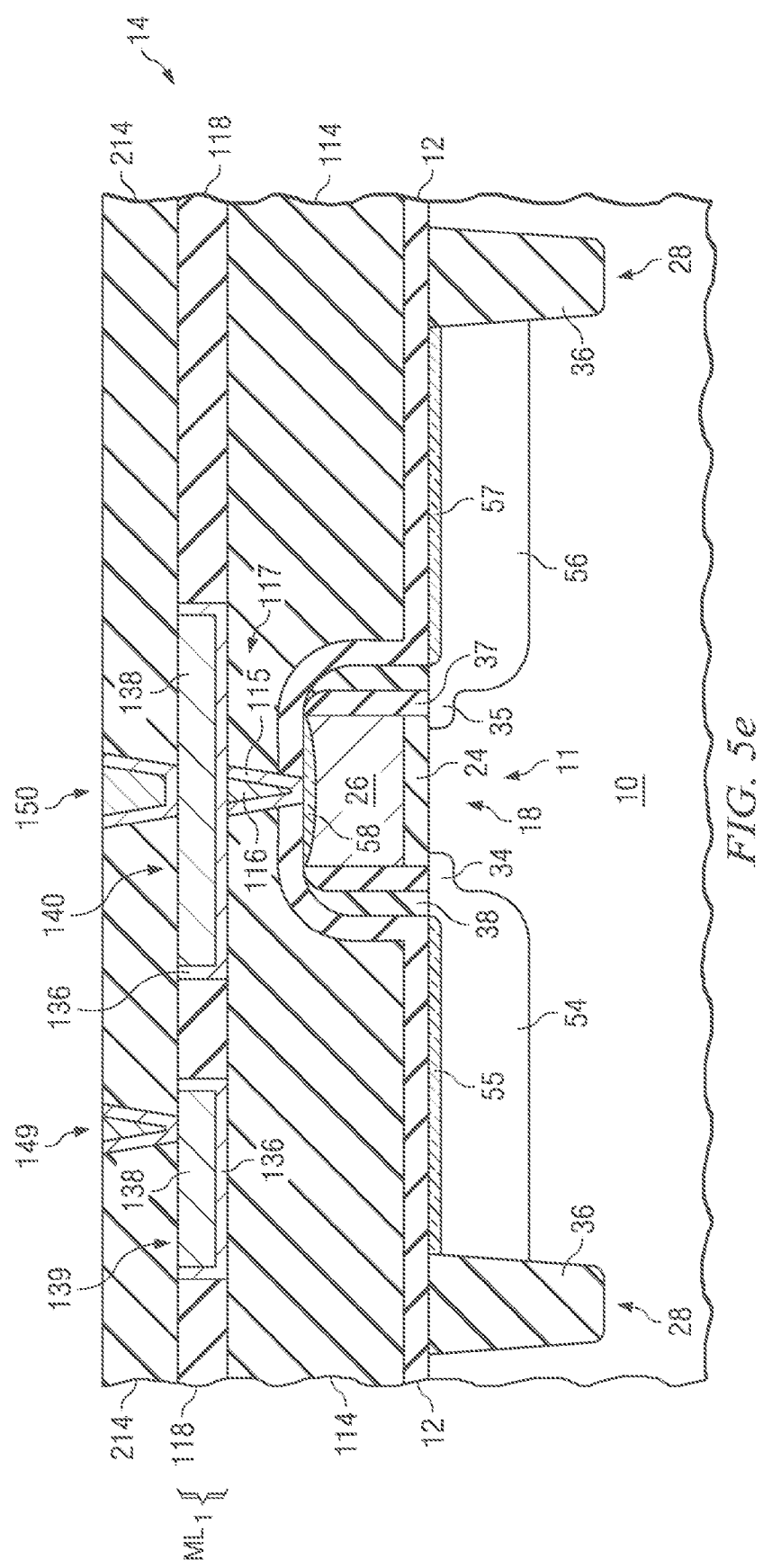
Figure 6:
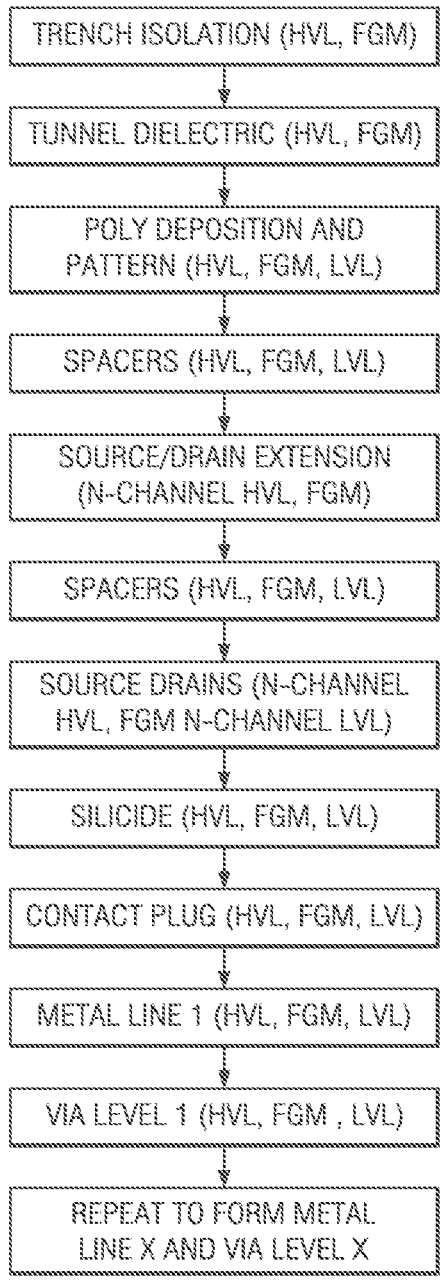
FIG. 6 illustrates a flow diagram of one implementation of the first embodiment process.
Figure 8:
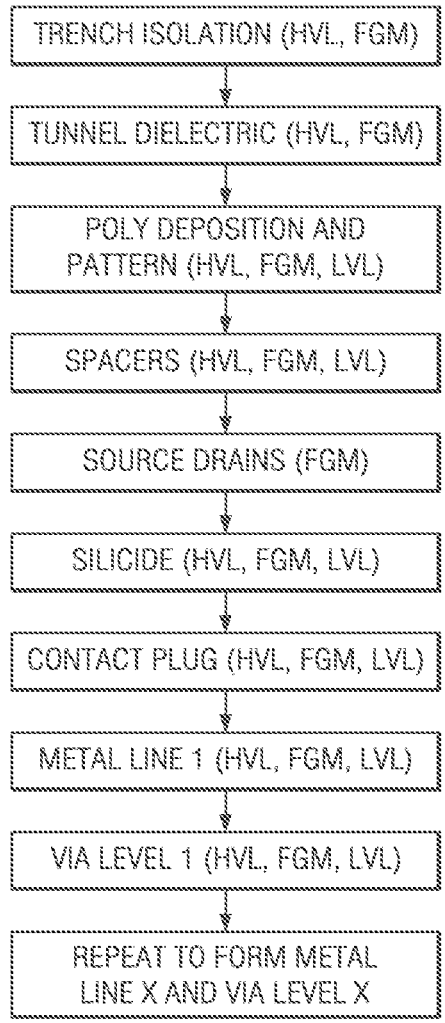
FIG. 8 illustrates a flow diagram of one implementation of the second embodiment process.

An exemplary floating gate transistor device is shown in FIG. 1 and various methods for the formation of floating gate transistor devices using these concepts will then be described with respect to the cross-sectional views of FIGS. 5a-5e and FIG. 7 and the flow charts of FIG. 6 and FIG. 8.

Figure 1A:
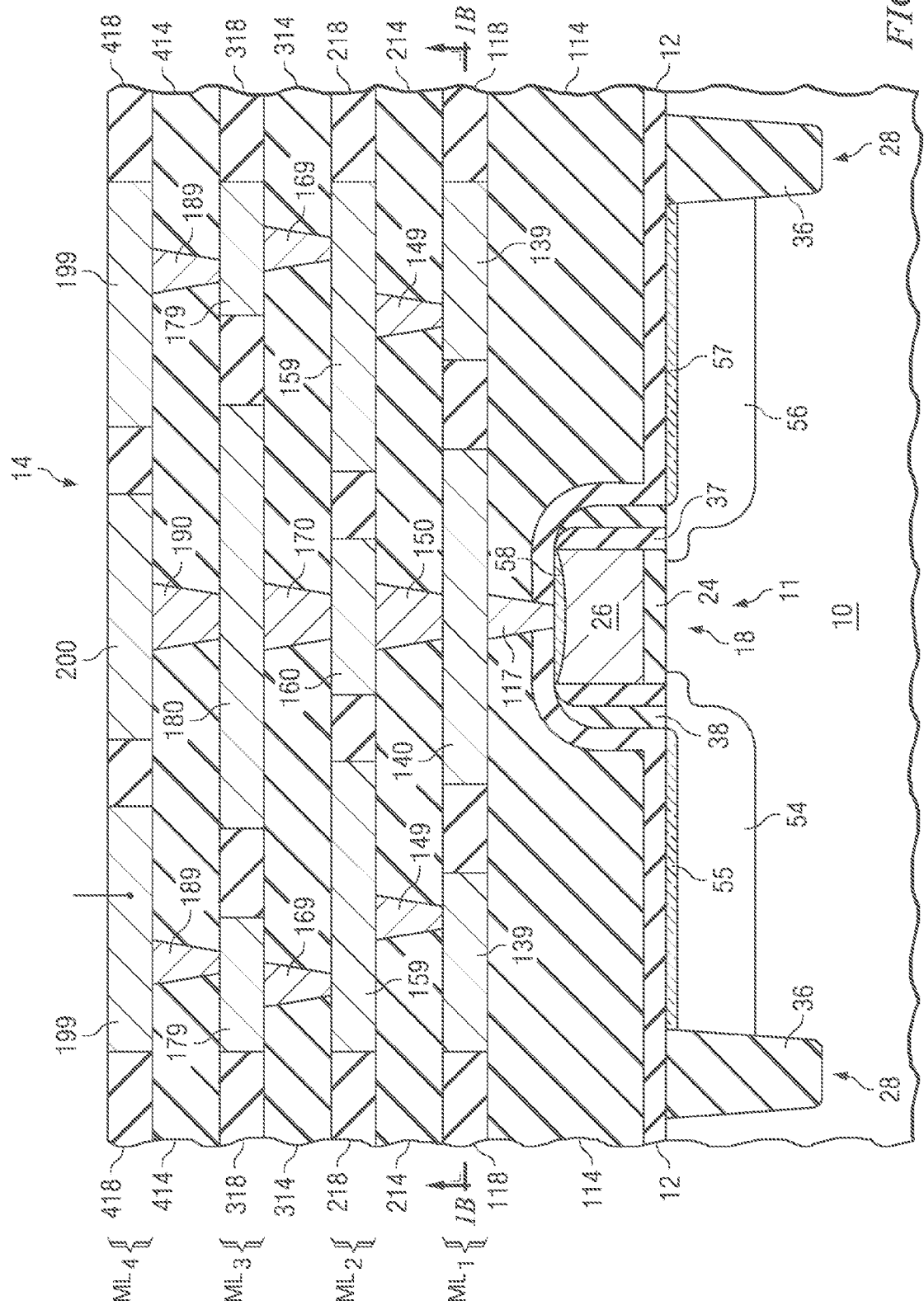
FIGS. 1a-1c, illustrates a floating gate transistor device structure, fabricated using concepts of an embodiment of the present invention.
Figure 1B:
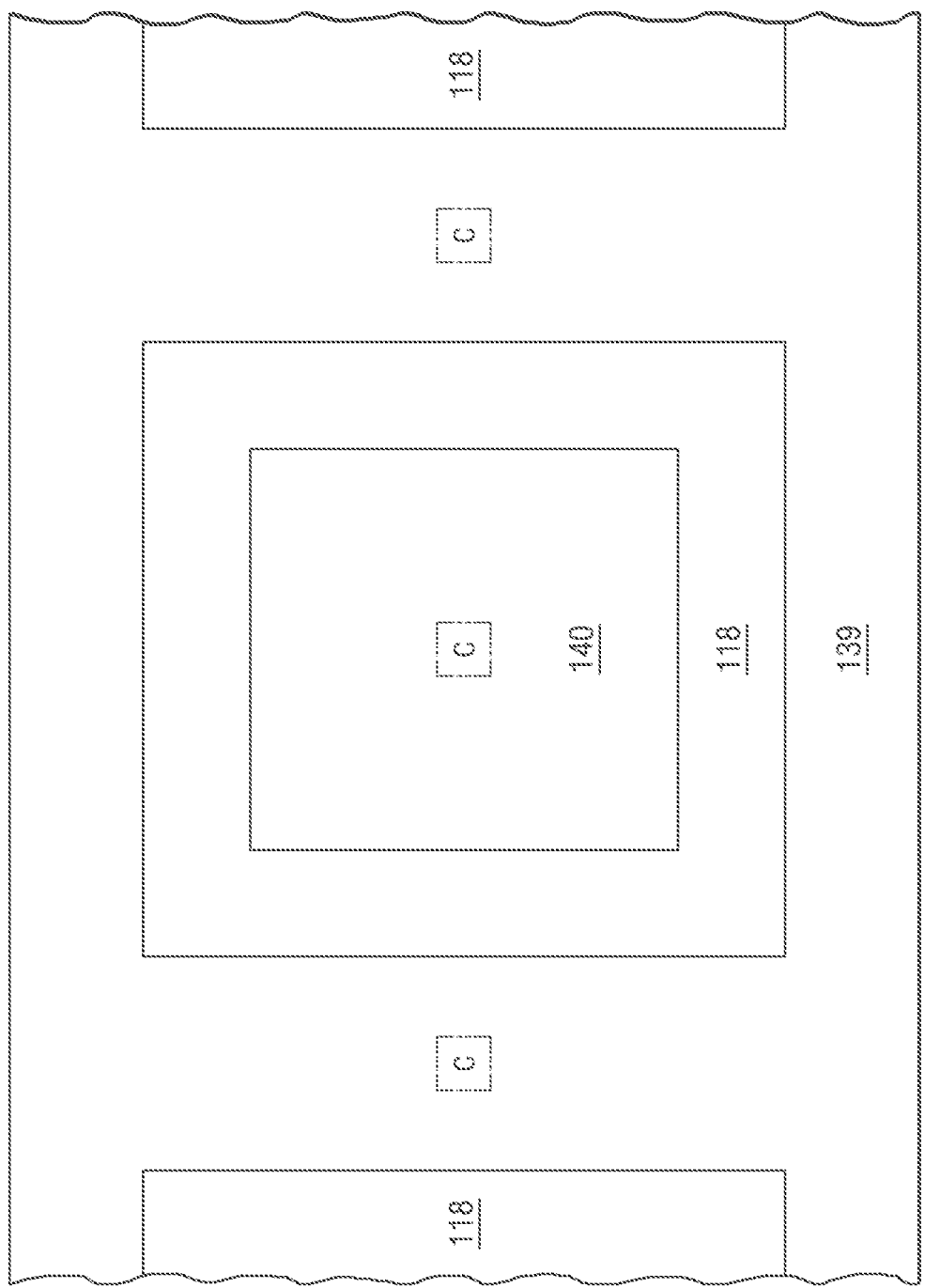
Figure 1C:
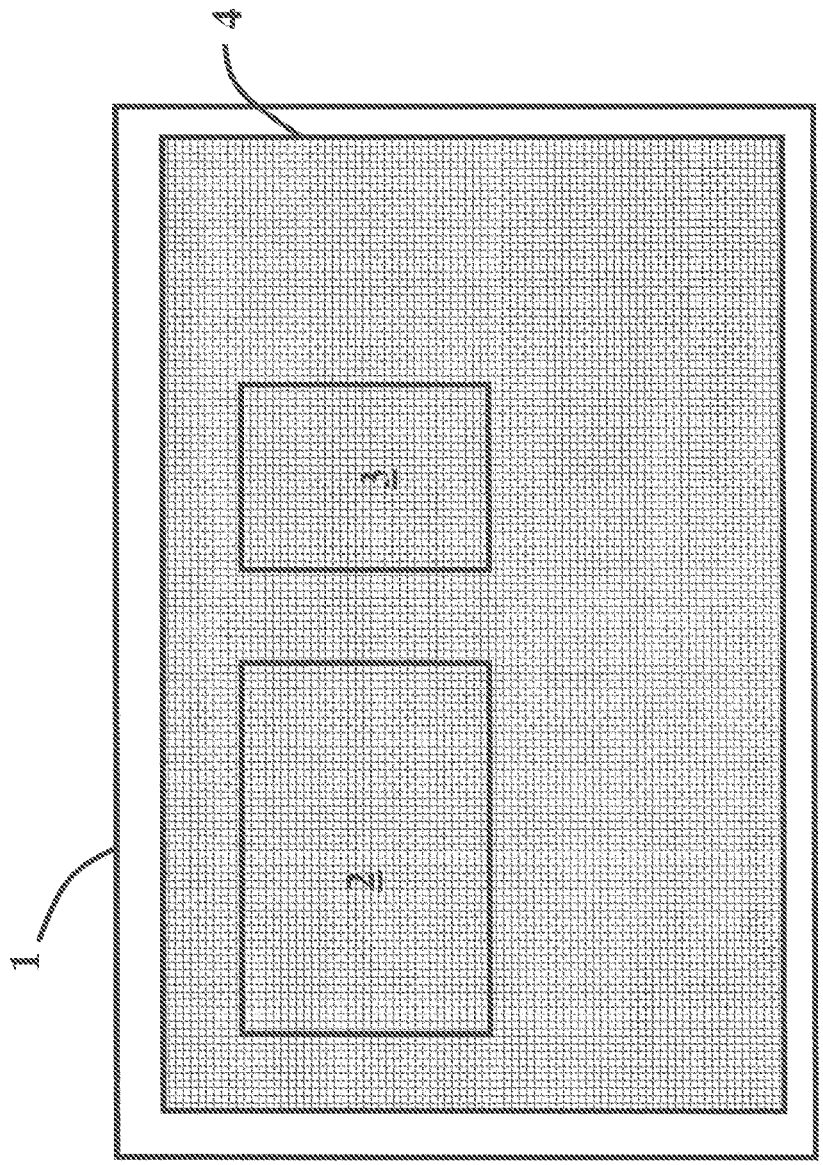

FIGS. 1a-1c illustrate an embodiment of the present invention, wherein a floating gate transistor device 14 is formed in the semiconductor body 10. In particular, the interconnect metallization used in a standard CMOS process flow form the floating gate electrode and the control gate electrode. The intra metal and inter metal dielectric region forms the floating gate electrode to the control gate electrode capacitor, and comparable to the interpoly dielectric in a conventional floating gate device.

Referring to FIG. 1a, the floating gate transistor is shown along with the metallization levels. Further, the floating gate transistor 14 includes a channel region 18 disposed in the semiconductor body 10. A tunnel dielectric 24 overlies the channel region 18 and a floating gate electrode 26 overlies the tunnel dielectric 24. A source region 54 and a drain region 56 are disposed in the semiconductor body and spaced from each other by the channel region 18. The silicide regions are formed in the source, drain and floating gate electrode regions (54, 56 and 26) forming source contacts 55, drain contacts 57 and gate contacts 58. An insulating layer 114 lined with a etch stop liner 12 is over the silicide regions. Conducting contact plugs 117 are made to the floating gate electrode in the insulating layer 114.

The floating gate contact plugs 117 are connected to the first level of metal line (ML1) 140 embedded in a second insulating layer 118. Similarly, another metal line 139 that is capacitively coupled to the floating gate is disposed in the second insulating layer 118. Contact vias 149 and 150 are coupled to the metal lines 139 and 140 and embedded in insulating dielectric 214. Similarly the second level of metal lines ML2 comprises metal lines 159 and 160 in insulating dielectric 218. Subsequent metal lines and via are similarly stacked in insulating layers. For example, the third and fourth levels are embedded in the dielectric layers 314, 318, 414, and 418. Thus, the floating gate stack of metal line and via include plug 117, metal line 140, via 150, metal line 160, via 170, metal line 180, via 190 and metal line 200. Similarly, the control gate stack includes metal line 139, via 149, metal line 159, via 169, metal line 179, via 189 and metal line 199. The current embodiment shows some reverse scaling, whereby some of the higher levels (e.g., vias) are shown larger than the lower levels to reduce resistance. However, this may not always be the case. The metal line along a top cross section cut along the line 1B of FIG. 1a is shown in FIG. 1b.

Hence, in FIG. 1b (top cross section of the layout at first metal level), the control gate electrode 139 surrounds the floating gate electrode 140. Both electrodes are embedded in the insulating layer 118 and form a MIM capacitor. The capacitance of the MIM capacitor, thus includes additional fringing capacitance besides the parallel plate capacitance showed in the cross section FIG. 1a. The contacts represented by the symbol "c" in the figure are not in the plane of the cut line.

FIG. 1c illustrates a broader top view of the integrated circuit 1 having the metallization 4 disposed over the logic 2 and memory devices 3. The metallization interconnects the logic 1 and memory devices 2 and forms at least portions of the control gates and the floating gates of the memory devices 2.

The control gate, for example, in FIG. 1a is coupled to a control gate node. For example, it may be connected to the next device or an external voltage source. Although the current embodiment shows only four metal levels, any number of suitable metal levels may be used.

Figure 2A:
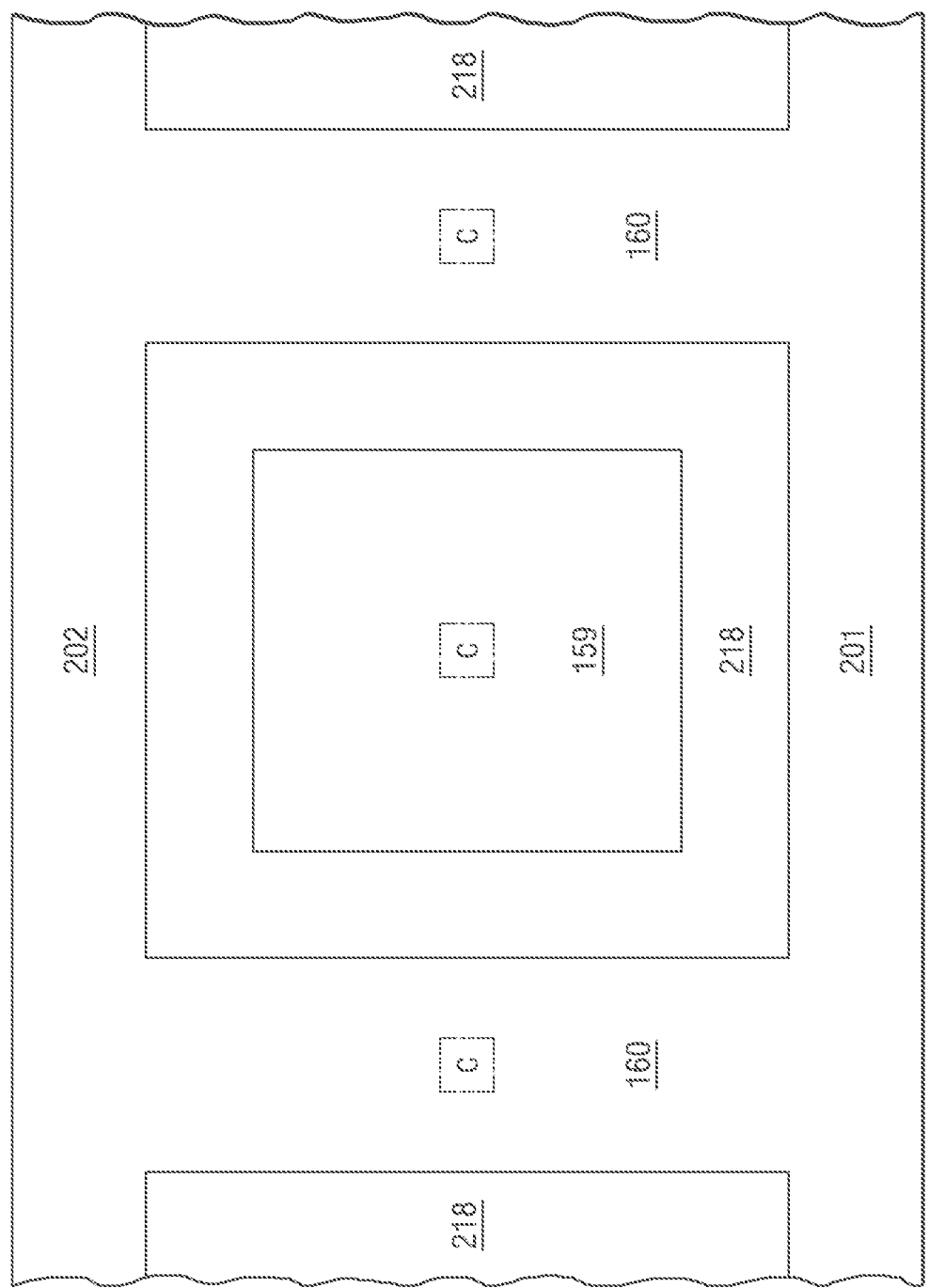
FIGS. 2a-2e illustrate a top cross section at the first metal level of a floating gate transistor device structure, fabricated using alternate embodiments of the invention.

FIG. 2a shows an alternate embodiment of the present invention. In one embodiment, subsequent metal levels were laid out identically at all metal levels as is shown in FIG. 1b. In other words, a similar cross section taken at second metal level is identical to the cross section shown in FIG. 1b. However, in a preferred embodiment subsequent metal levels can be modified to increase the capacitive coupling between the metal levels. For example, FIG. 2a represents the top cross section of the layout at metal level two. Here, the floating gate electrode 160 surrounds the control gate electrode 159. An insulating dielectric 218 along with the electrodes 159 and 160 forms the metal insulator metal (MIM) capacitor. Unlike the previous case, regions 201 and 202 of the floating gate electrode 160 capacitively couple to the bottom level of the control gate 139 through the insulator 218. In this embodiment, all odd metal levels could be laid out as shown in FIG. 1b while even metal lines are laid out as shown in FIG. 2a or vice versa.

Figure 2B:
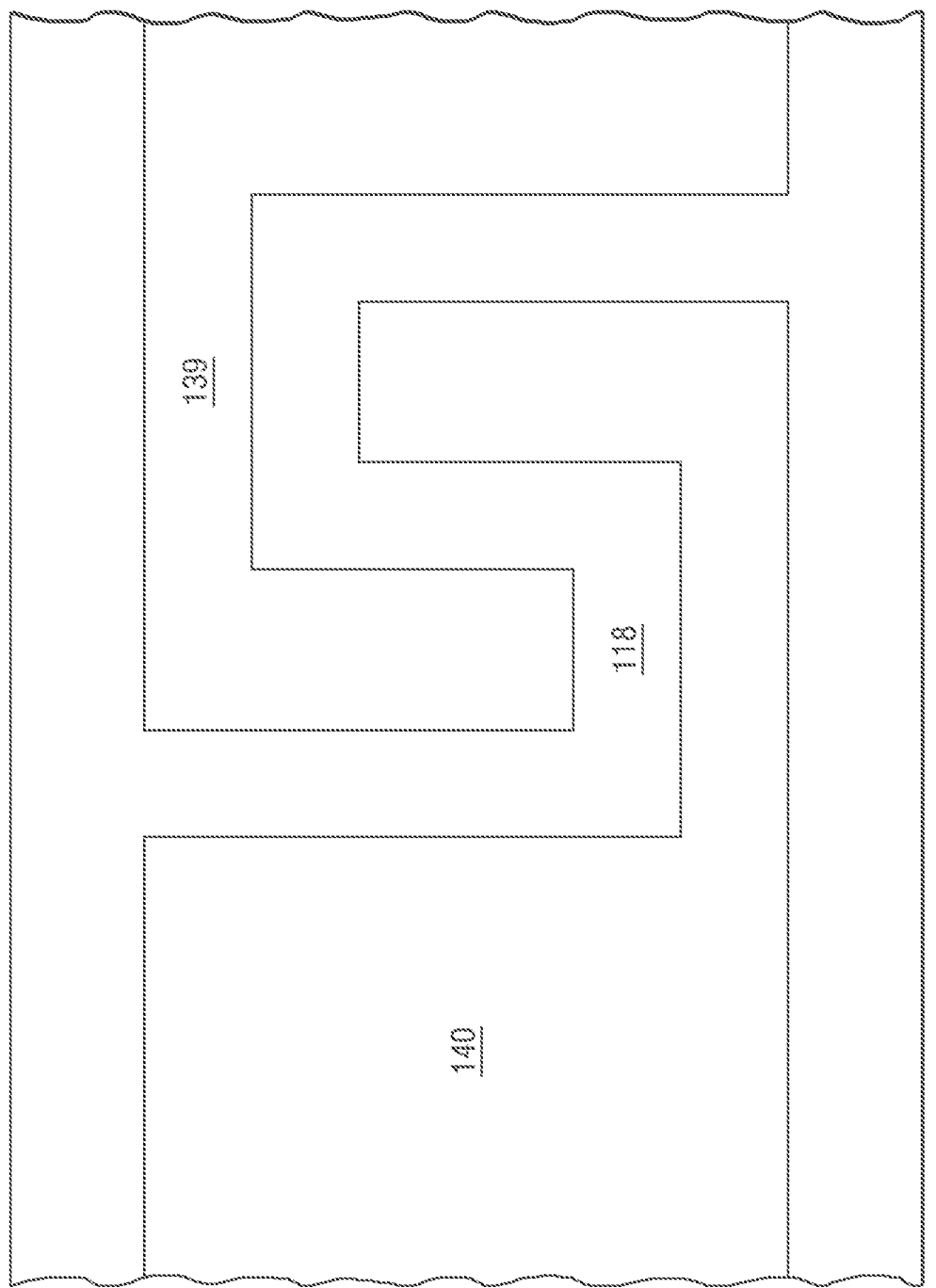
Figure 2C:
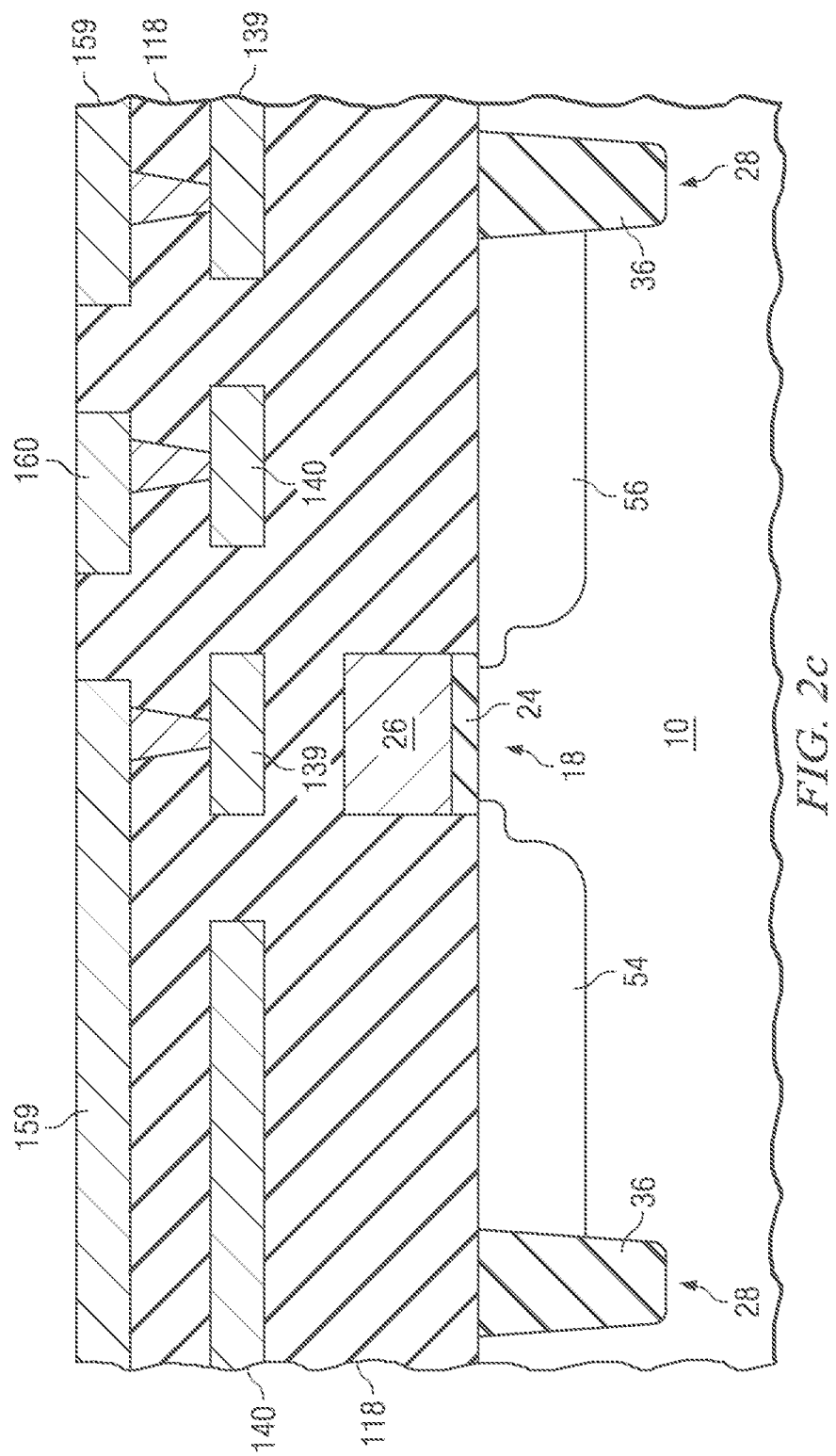

In some embodiments, the metal layers that form the control gate and floating gate may be interlocked to increase the coupling ratio of the gates. FIG. 2b (top cross sections of the layout at first metal level), illustrates such an interlocked structure. Here the two electrodes (floating gate and control gate) are arranged in an interlocking finger structure. The fingers may further be staggered between the metal levels (for example, between metal level one to metal level two) to increase coupling ratio of the two gates. FIG. 2c shows another embodiment of the present invention using a finger structure with two levels of metallization integrated vertically. Consequently, the control gate 139 is embedded in the floating gate 140 electrode increasing gate coupling. Some of the contacts for the control gate are out of plane and hence not shown.

Figure 2D:
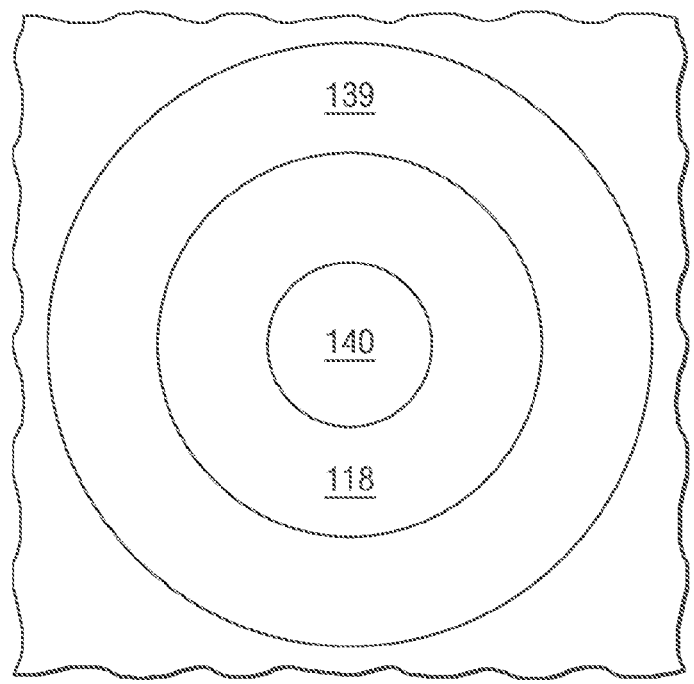
Figure 2E:
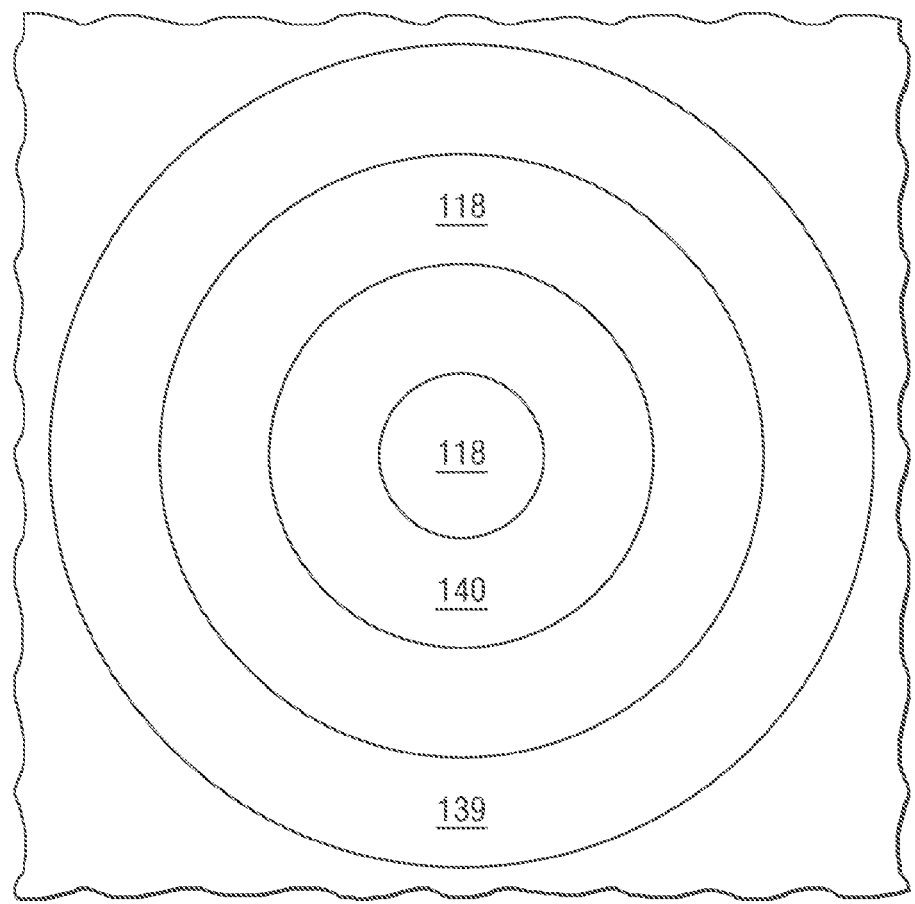

FIGS. 2d and 2e show further embodiments (top cross sections of the layout at first metal level), whereby the two metal lines 139 and 140 are circular and form a cylindrical capacitor plate. As described above, the control gate electrode 139 surrounds the floating gate electrode 140, for example, such that the distance between the floating gate electrode 140 and the control gate electrode 139 does not vary around the floating gate electrode 140.

In other embodiments, the floating gate electrode and control gate electrodes can be laid out in various other shapes and combinations to maximize the capacitive coupling and thus minimize the program and erase times of the transistor. The metal layouts can also be modified to account for other features such as interconnects that may need to be routed in the vicinity of the gates.

Figure 3A:
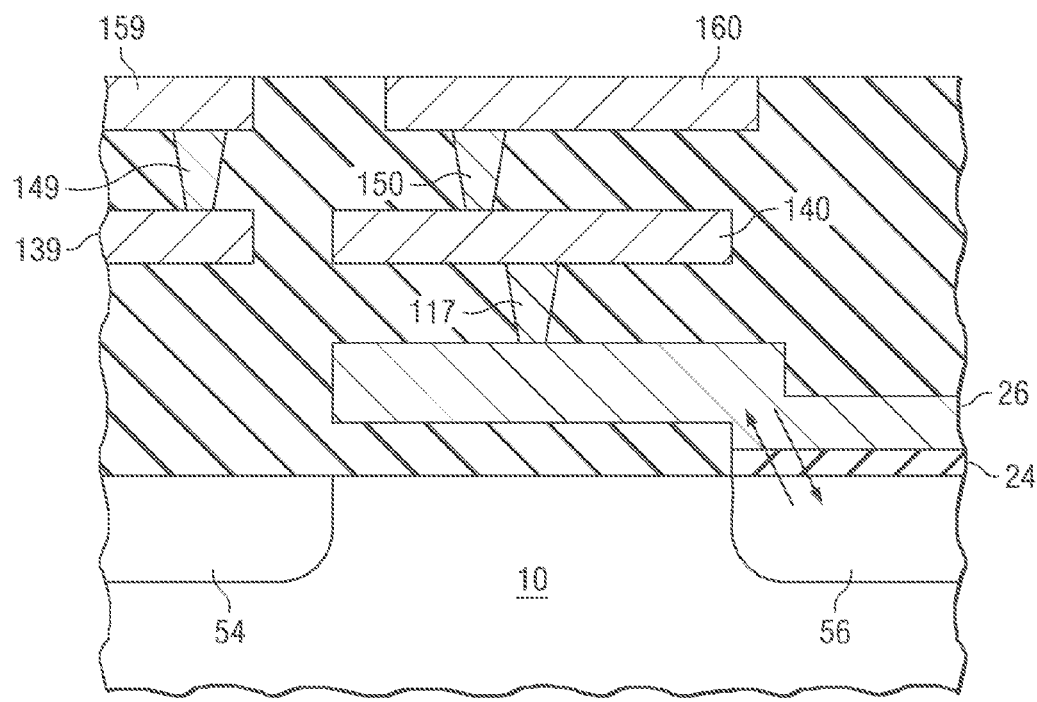
FIGS. 3a-3c illustrate embodiments of the present invention to form a memory circuit.
Figure 3B:
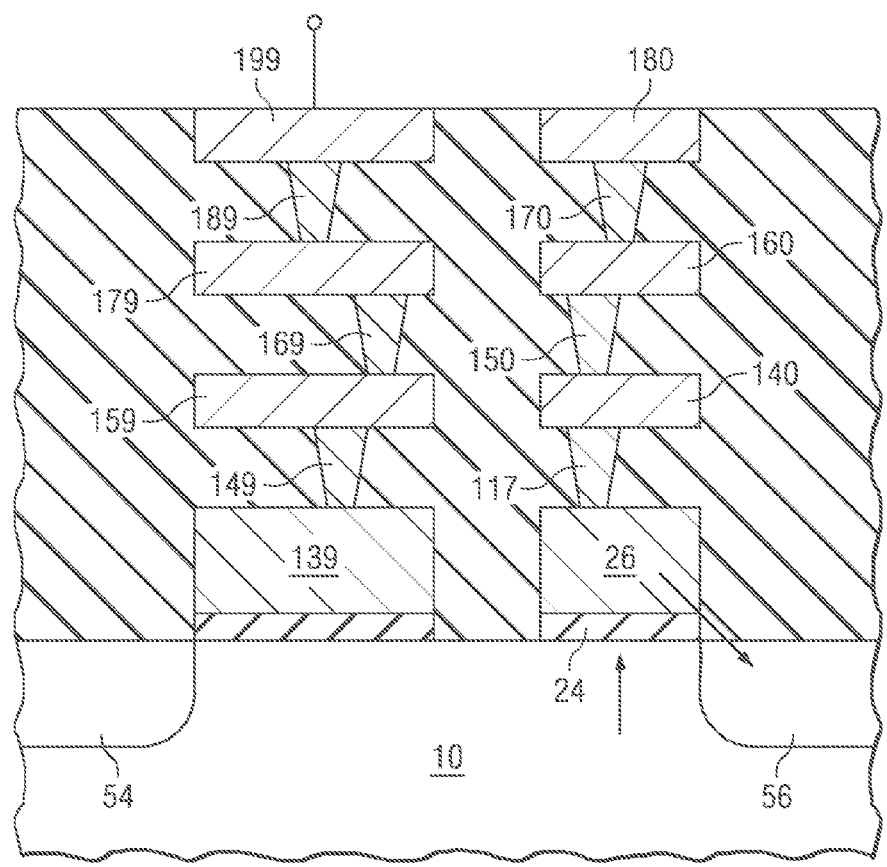
Figure 3C:
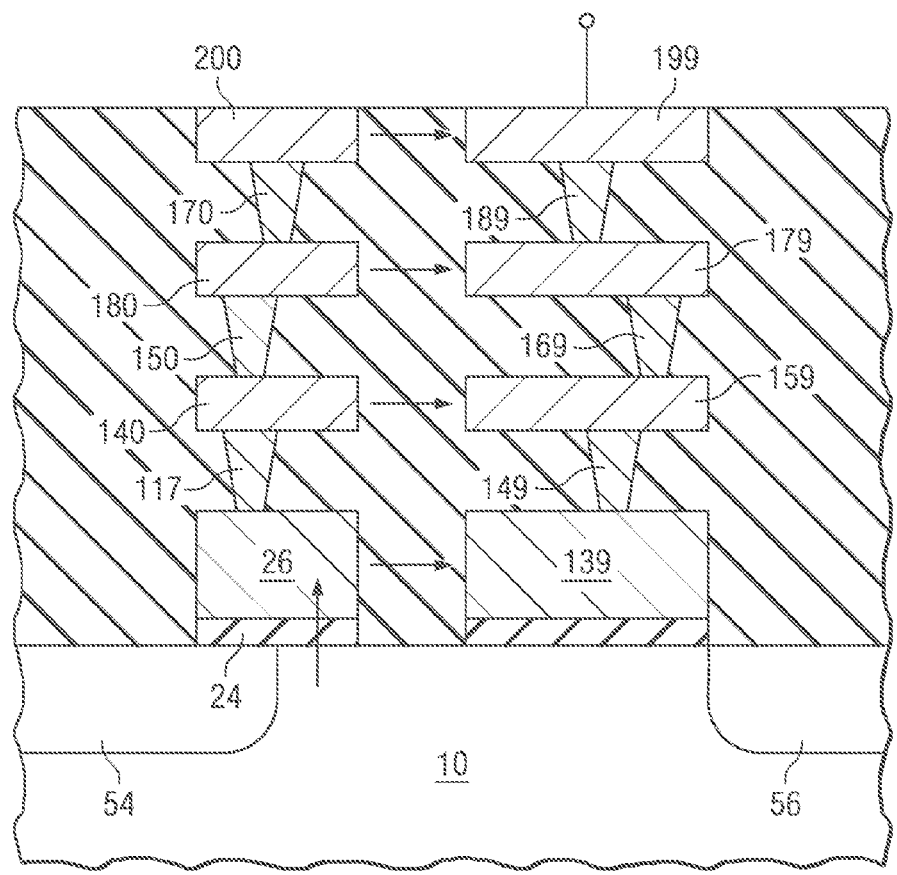

While not illustrated, various layouts of the same gate can be interconnected with additional contacts to reduce intra gate resistance. These contacts are preferably formed close to an opposite gate layer to further increase capacitive coupling between the control and floating gates. The present invention will now be discussed in various embodiments of the memory cell design. The current embodiment shown in FIG. 1a is equivalent to a stacked dual poly Flash memory cell. However, in various other embodiments, the current invention may be part of a different type of non volatile memory cell. Such examples include EPROM, EEPROM cells such as FLO-TOX™ EEPROM, Flash EEPROM, and other cells such as ETOX™, split gate flash stacked gate flash, source coupled split gate flash and source side injection and DINOR cells. Examples of such embodiments are shown in FIGS. 3a-3c. All region numbers correspond to earlier descriptions from FIG. 1a. FIG. 3a shows a FLOTOX™ memory cell using the current embodiment, wherein the tunneling gate dielectric 24 and hence window is formed over the drain region 56 of the memory device. The arrows shown in the FIGS. 3a-3c represent the possible flow of charge during program and erase operations. FIG. 3b shows another embodiment of the current invention producing a split gate memory cell. The lower control gate region 139 in this embodiment may either be a poly line or a metal line. Finally, FIG. 3c shows the source side injection memory cell. The erase mode of such a cell may occur through carrier tunneling from the floating gate stack into the control gate stack. In some embodiments, the erasure may also be performed by carrier tunneling from the floating gate stack 139 to the source region 54. As in FIG. 3b, the lower control gate region 139 if present, may either be a poly line or metal line.

In various embodiments, the program and erase operations of the floating gate memory device may involve either electrons or holes as the charge carriers. In the current embodiment, the floating gate transistor is an n-channel transistor so that the source and drain region are n-type. The program and erase operation occur, for example, by electron tunneling as in Fowler Nordheim tunneling or by electron injection over a tunnel dielectric barrier as with channel hot electron injection. However, in some embodiments, the device may be a p-channel transistor. Even in such cases, the program operations may be performed by electrons as in band to band tunneling induced hot electron injection. The erasure of such devices may occur by hot hole injection.

Figure 4A:
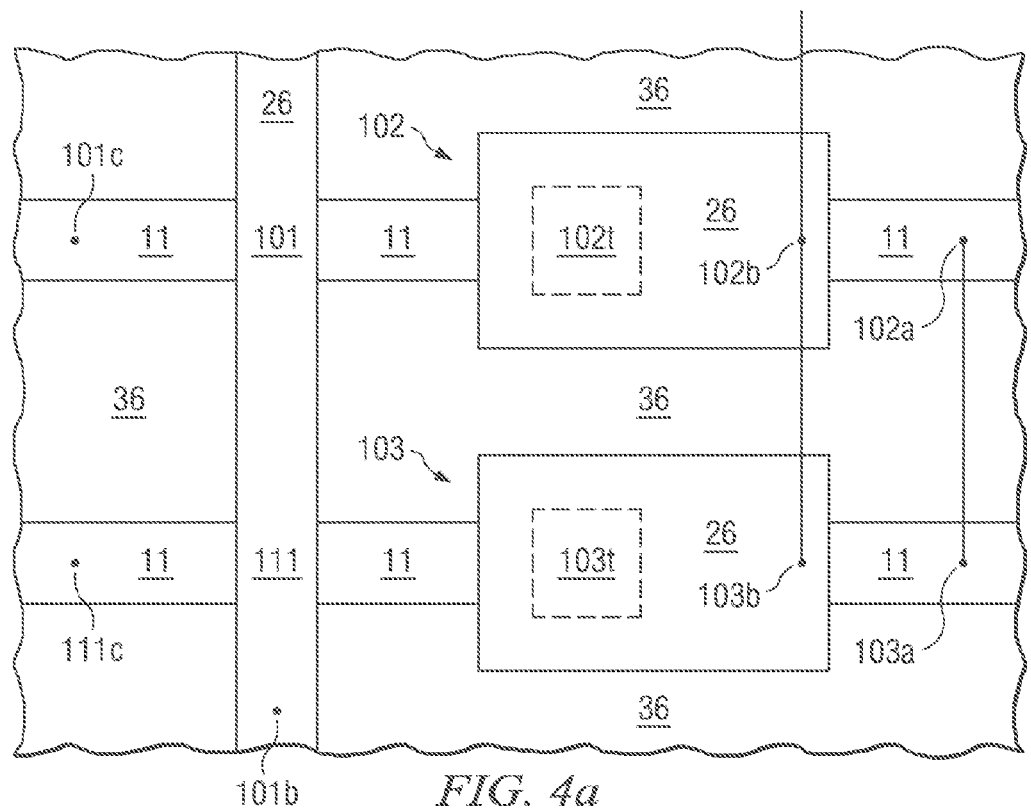
FIGS. 4a-4b illustrate embodiments of the present invention to form a memory circuit.

FIG. 4a shows a memory circuit layout formed using an embodiment comprising transistors 101 and 111, and floating gate transistors 102 and 103. The layout comprises active silicon regions 11, isolation regions 36, and poly lines 26 forming transistors 101 and 111, and floating gate transistors 102 and 103. The gate 101b of the field effect transistor 101 is connected to a voltage source and forms the select line. The sources of the floating gate devices 102a and 103a of the floating gate transistors are connected to a source potential. The drains of the transistors form the bit lines 101c and 111c of the memory cell. The floating gate transistors 102 and 103 further comprise tunneling windows 102t and 103t, wherein the gate oxides of the floating gate transistors are thinner relative to the rest of the oxide underlying the poly lines 26 in the floating gate transistors 102 and 103. Hence, the regions 102t and 103t form tunneling windows for the floating gate devices 102 and 103.

The memory cell can be programmed by a suitable combination of voltages. As an example, floating gate transistors may be programmed by applying about 12 volts (V) on the control gate 102b, and applying about 5 V to the drain e.g., using a potential on the bit line 101c while grounding the source contact 102a. The floating gate may similarly be erased by applying a negative potential (example, about −12V) to the control gate 102b and applying a positive voltage (example, about 5V) on the bit line 101c, while turning on the transistor 101 by a suitable positive voltage on the gate 101b. Although the discussed embodiments use a combination of positive and negative voltages to program and erase the floating gate devices, in some embodiments only a positive voltage may be used. For example, in a specific embodiment, the program operation may be performed by using a positive voltage on the control gate 102b while grounding the drain of the floating gate transistor 102. Similarly, in this embodiment, the erasure may be performed by applying a positive voltage on the drain of the floating gate transistor 102, while grounding the control gate 102b. Similarly, in other embodiments, the program and erase operations may be performed using other suitable combinations of voltages. The current state of the cell is identified for example by applying a nominal operating voltage on the control gate 102b (example, about 5V) and the drain contact (example, about 2V on 101c) while grounding the source node 102a.

Figure 4B:
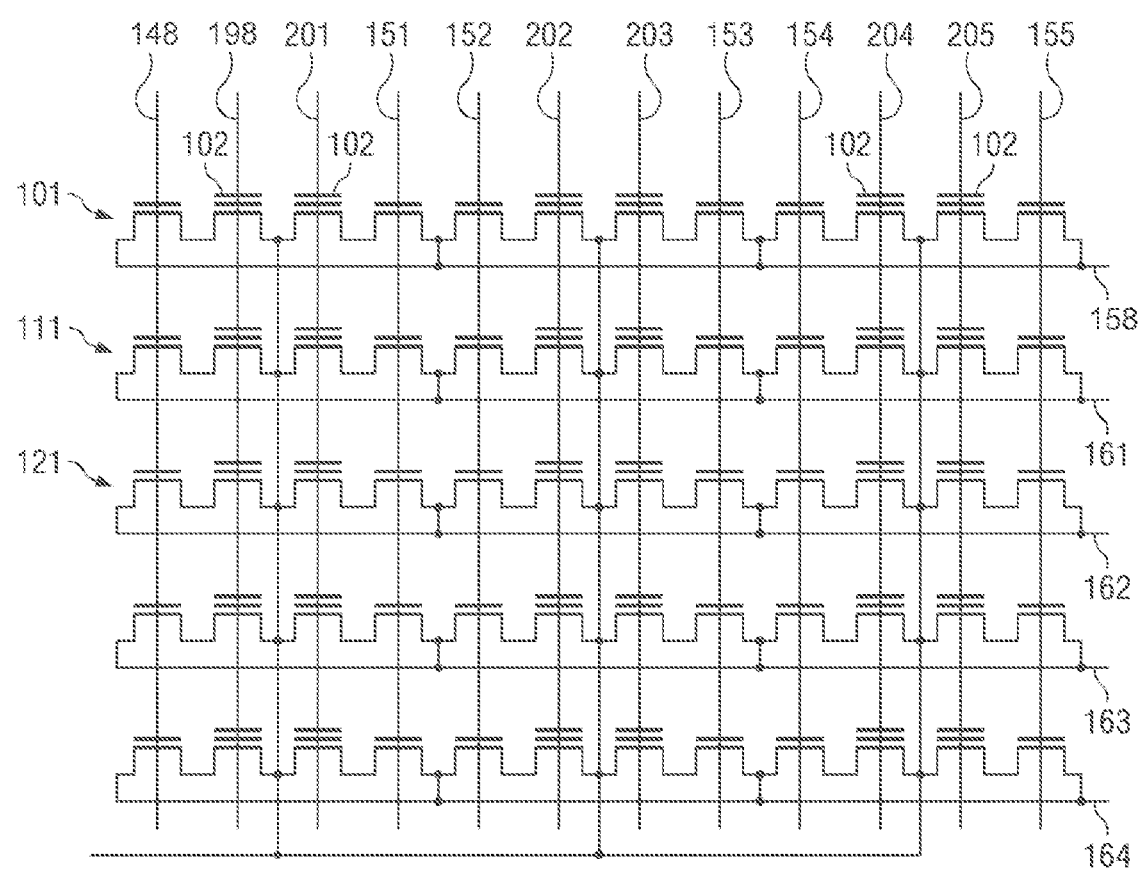

In other embodiments, the floating gate cells and the field effect select gate transistors can be stacked in rows and columns in an integrated circuit and form part of a NAND, NOR, AND and any other suitable memory array. An example of such a memory array is shown in FIG. 4b. The array comprises a 2 T EEPROM cell with for example, a select gate transistors 101 and a floating gate transistors 102. The select gates of the memory array are controlled by select lines 148, 151, 152, 153, etc. The sources of the select gates transistors 101 are connected to the bit lines 158, 161, 162, 163, etc. The drains of the select gates are further connected to the drains of the floating gate transistors 102. The gates of the control gate transistors are tied to form word lines 198, 201, 202, 203, etc. of the memory array.

In different embodiments, the floating gate memory device may also be part of a flash memory cell array. Different configurations of such memory cell arrays are possible such as NOR, NAND, DiNOR and AND. For example, if the floating gate memory cell shown in FIG. 1a is part of a NOR flash cell, it may be programmed for example, by applying voltage of about 5V to the drain contact 57 and voltage of about 12V on the control gate electrode stack, while grounding the source contacts 55. The cell may be erased by applying a voltage of about 12V on the source contact 55. The state of the cell may be sensed or read, for example, by applying a drain voltage of about 1V along with a gate voltage of about 5V. The state of the floating gate transistor is identified by the threshold voltage or the drain current which is impacted by the trapped charge in the floating gate.

Similarly, if the floating gate memory cell shown in FIG. 1a is part of NAND flash cell, it may be programmed by applying a control gate voltage of about 17V, while grounding the source 55, drain 57 contacts. Similarly, the cell may be erased by applying a potential of about 17V on the well or substrate contact while grounding the control gate. In other embodiments, the cell may be erased by applying a potential of about −17V on the control gate electrode, while grounding the substrate or well contact in all the three phases.

A preferred embodiment process flow will now be discussed for fabricating the floating gate devices. As one advantageous feature, this process flow can be used to simultaneously form both logic and memory devices. All the parts of the disclosed device are formed with processes common to logic devices. Logic devices can be either high voltage (HV) or low voltage (LV) devices. High voltage devices typically operate at voltages over a certain level (e.g., 3V), whereas low voltage devices operate at voltages below that level. For example, input/output transistors that talk to peripheral or outside circuits typically operate at higher operating voltages. Similarly, the core logic transistors that typically constitute the bulk of devices for a given technology are low voltage devices.

In one embodiment, the memory device is formed using the high voltage logic device flow. However, other logic device flow, for example, LV core $V_T$ device flow, may also be used to form the floating gate device with minimal changes. Similarly, other suitable device flows such as those used for making LV high $V_T$ or LV low $V_T$ devices may also be used. In some cases, some steps of the logic device flow may be omitted or masked to create a new floating gate device flow.

FIGS. 5a-5e provide cross-sectional diagrams illustrating a first embodiment method of forming a transistor of the present invention and FIG. 6 illustrates an associated flow diagram of one implementation of the process. In the flow chart described in FIG. 6, the exposed or open areas for a given process are represented in brackets as either high voltage logic (HVL), low voltage logic (LVL) or floating gate memory devices (FGM). While certain details may be explained with respect to only one of the embodiments, it is understood that these details can also apply to other ones of the embodiments.

Referring first to FIG. 5a, a semiconductor body 10 is provided. In the preferred embodiment, the semiconductor body 10 is a silicon wafer. Some examples of the body 10 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide or others can be used with the wafer.

In the first embodiment, isolation trenches 28 are formed in the semiconductor body 10. Isolation trenches 28 can be formed using conventional techniques. For example, a hard mask layer (not shown here), such as silicon nitride, can be formed over the semiconductor body 10 and patterned to expose the isolation areas. The exposed portions of the semiconductor body 10 can then be etched to the appropriate depth, which is typically between about 200 nm and about 500 nm. The trenches 28 define active area 11, in which integrated circuit components can be formed. The depth of the trench region may be different for the high voltage devices and the lower voltage devices. For example, the memory and high voltage devices may be built on a deep trench isolation whereas the low voltage devices may be built on a shallow trench isolation.

The trenches 28 are filled with an isolating material 36. For example, exposed silicon surfaces can be thermally oxidized to form a thin oxide layer. The trenches 28 can then be lined with a first material such as a nitride layer (e.g., $Si_3N_4$). The trenches can then be filled with a second material, such as an oxide. For example, a high density plasma (HDP) can be performed, with the resulting fill material being referred to as HDP oxide. In other embodiments, other trench filling processes can be used. For example, while the trench is typically lined, this step can be avoided with other fill materials (e.g., HARP™)

As also shown in FIG. 5a, the gate stack for the floating gate device is formed. Different gate dielectrics can be grown on the standard CMOS part of the semiconductor body by well known masking steps. In the preferred process, the gate dielectric formation process of the high voltage transistor is shared with the floating gate memory device. The gate dielectric or tunnel gate dielectric 24 is deposited over exposed portions of the semiconductor body 10. In the current embodiment, this tunnel gate dielectric 24 is an oxide layer about 100 Å thick. In a different embodiment, the tunnel gate dielectric 24 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as the tunnel gate dielectric 24. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the tunnel gate dielectric 24 can comprise other high-k insulating materials or other dielectric materials. As implied above, the tunnel gate dielectric 24 may comprise a single layer of material, or alternatively, the tunnel gate dielectric 24 may comprise two or more layers.

The tunnel gate dielectric 24 may be grown by thermal oxidation, or deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the tunnel gate dielectric 24 may be deposited using other suitable deposition techniques. The tunnel gate dielectric 24 preferably comprises an equivalent oxide thickness (EOT) thickness of about 50 Å to about 200 Å. In one embodiment, alternatively, the tunnel gate dielectric 24 may comprise other dimensions. In some cases, only a small portion of the gate dielectric is thinned to allow tunneling of carriers such as electrons.

In the illustrated embodiment, the same dielectric layer would be used to form the gate dielectric for both the p-channel/n-channel transistors of the high voltage device and the tunnel gate dielectric 24 of the memory device. This feature is not however required. In alternate embodiments, the tunnel dielectric could be grown selectively in the memory areas. Similarly, in alternate embodiments, the tunnel dielectric could be grown along with either the p-channel transistors or the n-channel transistors.

After the formation of all the needed gate oxides for other devices (for example, low voltage logic devices such as core $V_T$, low $V_T$, and high $V_T$ devices etc.), all regions of the semiconductor body are opened. The gate electrode is then deposited across the whole semiconductor wafer. This forms the floating gate electrode 26 over the tunnel dielectric 24. The floating gate electrode 26 preferably comprises a semiconductor material, such as polysilicon or amorphous silicon, although alternatively, other semiconductor materials may be used for the floating gate electrode 26. In other embodiments, the floating gate electrode 26 may comprise TiN, TiC, HfN, TaN, TaC, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the floating gate electrode 26 comprises a doped polysilicon layer underlying a silicide layer (e.g., titanium silicide, nickel silicide, tantalum silicide, cobalt silicide, or platinum silicide).

The floating gate electrode 26 may comprise a plurality of stacked gate materials, such as a metal underlayer with a polysilicon cap layer disposed over the metal underlayer. A floating gate electrode 26 having a thickness of between about 400 Å to 2000 Å may be deposited using CVD, PVD, ALD, or other deposition techniques. In other embodiments, different types of transistors can include gates of different materials and/or thicknesses.

The gate layer (and optionally the tunnel gate dielectric layer) is patterned and etched using known photolithography techniques to create the floating gate electrode 26 of the proper pattern. This also forms the gate electrode on the low voltage logic and high voltage logic areas.

Referring now to FIG. 5b, after forming the floating gate electrodes, a thin layer of spacers 37 is formed. Spacer layers 37 are formed from an insulating material such as an oxide and/or a nitride, can be formed on the sidewalls of the gate electrode 26. The spacers are typically formed by the deposition of a conformal layer followed by an anisotropic etch. The process can be repeated for multiple layers, as desired. In some cases, if the gate electrode 26 is polysilicon, the thin spacers 37 may be formed by poly oxidation. This device at this stage is shown in FIG. 4a.

As shown in FIG. 5b, the source/drain extension regions (34 and 35) can be implanted using this structure (the gate electrode 26 and thin spacer 37) as a mask. Other implants (e.g., pocket implants, halo implants or double diffused regions) can also be performed as desired. If a p-type transistor is to be formed, a p-type ion implant along with a n-type halo implant is used to form the source 34 and drain 35 extension regions. For example, boron ions can be implanted with a dose of about $1 \times 10^{14}$ cm$^{-2}$ to about $3 \times 10^{15}$ cm$^{-2}$ at an implant energy between about 0.5 keV to about 10 keV. In other embodiments, other materials, such as $BF_2$ or cluster boron can be implanted. In some cases, the n-type halo implant is arsenic with a dose of about $1 \times 10^{13}$ cm$^{-2}$ to about $2 \times 10^{14}$ cm$^{-2}$ at an implant energy between about 10 keV to about 100 keV. If an n-type transistor is to be formed, an n-type ion implant along with a p-type halo implant is used to form the source 34 and drain 35 extension regions.

In the preferred embodiment, arsenic ions are implanted into the source/drain extension regions 34/35. For example, as ions can be implanted with a dose of about $1 \times 10^{14}$ cm$^{-2}$ to about $3 \times 10^{15}$ cm$^{-2}$ and an implant energy between about 0.5 keV and about 15 keV. In other embodiments, other materials, such as P and Sb can be implanted. In some cases, the p-type halo implant is boron with a dose of about $1 \times 10^{13}$ cm$^{-2}$ to about $2 \times 10^{14}$ cm$^{-2}$ at implant energies between about 1 keV and about 10 keV. In some embodiments, the extension implants can also contain additional implants such as for amorphization or reducing diffusion. Some examples of such implants include silicon, germanium, fluorine, carbon, nitrogen, and/or combinations thereof. Source and drain spacers 38, can be formed on the sidewalls of the existing thin spacer 37.

FIG. 5b shows the device after it has been exposed to an ion implant step which forms the source/drain regions 54/56 of the transistor. Similar to the formation of the extension regions 34 and 35, if a p-type transistor is to be formed, a p-type ion implant is used to form the heavily doped source 54 and drain 56 regions. For example, boron ions can be implanted with a dose of about $1 \times 10^{15}$ cm$^{-2}$ to about $3 \times 10^{15}$ cm$^{-2}$ at implant energies between about 1 keV and about 5 keV. In other embodiments, other materials, such as $BF_2$, molecular boron, or cluster boron can be implanted. If an n-type transistor is to be formed, an n-type ion implant is used to form the heavily doped source 54 and drain 56 regions. In the preferred embodiment, arsenic ions are implanted into the source/drain regions 54/56. For example, as ions can be implanted with a dose of about $1 \times 10^{15}$ cm$^{-2}$ to about $5 \times 10^{15}$ cm$^{-2}$ and an implant energy between about 5 keV and about 30 keV. In other embodiments, other materials, such as P and Sb can be implanted. In some embodiments, fluorine, carbon, nitrogen, silicon, germanium or combinations of these materials are co-implanted along with the source drain implants.

In this embodiment, the floating gate devices and high voltage logic devices are implanted at the same time. However in some embodiments, they may be masked separately and different implant conditions may be used.

A source drain anneal follows the source drain implants. This is done to remove the implantation damage and form the junctions. This anneal step is preferably performed at a temperature between about 700° C. and about 1200° C., for a time between about 0.1 ms and about 1 s. For example, a rapid thermal anneal (RTA) can be performed at a temperature of 1090° C. for 0.1 s.

Referring to FIG. 5c, a suitable silicide metal is deposited over the source, drain and gate electrode regions. The semiconductor body 10 is then heated to about 500° C. to 700° C. The exposed part of the source and drain (54 and 56) regions react with the filled silicide metal to form a single layer of metal silicide. Any un-reacted silicide metal may be removed. In the preferred embodiment, the silicide metal is cobalt, but could also be nickel, nickel platinum, copper, molybdenum, titanium, tantalum, tungsten, erbium, zirconium, platinum, or combinations thereof. The preferred anneal is about 500° C. but any other suitable anneal can be used. The silicidation of the source/drain (54 and 56) regions result in formation of silicide regions (source contacts 55 and drain contacts 57) with a thickness of about 50 Å to about 300 Å. If the floating gate electrode comprises a polysilicon material, the gate region may also be silicided.

In the present embodiment, the contact material is a silicide, and the source/drain and gate regions are comprised of silicon. However in some cases, the source drain regions may also be other materials such as SiC, SiGe, Ge, GaAs, InSb. In such cases, a suitable contact material can be selected that provides low contact resistance. For example, if embedded SiGe is used for the source drain regions, the contact material may be a combination of silicide and germanide.

Next, the device undergoes back end of the line manufacturing, wherein, contacts are made to the semiconductor body and interconnected using metal lines and vias. Modern integrated circuits incorporate many layers of vertically stacked metal lines and vias (multilevel metallization) that interconnect the various components in the chip.

Referring now to FIG. 5c, a first insulating material layer 114 is then formed over a etch stop liner 12. The etch stop liner 12 is deposited over the semiconductor body. For example, a nitride film (e.g., silicon nitride) is deposited. The insulating material layer 114 preferably comprises insulating materials typically used in semiconductor manufacturing for inter-level dielectric (ILD) layers, such as $SiO_2$, tetra ethyl oxysilane (TEOS), fluorinated TEOS (FTEOS), doped glass (BPSG, PSG, BSG), organo silicate glass (OSG), fluorinated silicate glass (FSG), spin-on glass (SOG), SiN, SiON, or low k insulating materials, e.g., having a dielectric constant of about 4 or less, or combinations or multiple layers thereof, as examples, although alternatively, the insulating material layer 114 may comprise other materials. The ILD may also comprise dense SiCOH or a porous dielectric having a k value of about 3 or lower, as examples. The ILD may also comprise an ultra-low k (ULK) material having a k value of about 2.3 or lower, for example. The ILD may comprise a thickness of about 500 nm or less, for example, although alternatively, the ILD may comprise other dimensions.

As shown in FIG. 5c, in regions where the contact is to be made, the first insulating material layer 114 is etched down to the etch stop liner 12. In one exemplary process, photoresist (not shown) is deposited and patterned to mask off the non-exposed regions to the etch. The first insulating material layer 114 is then etched down to the etch stop liner 12 using standard etch techniques such as a reactive ion etch. In this step, the first insulating material layer 114 etches away at a faster rate than the etch stop liner 12. Once the etch is complete, the photoresist may be removed. Contact holes are formed by a second etch. This time, the etch stop liner 12 is etched to expose the source/drain regions 54/56 using the first insulating material layer 114 as a mask.

As illustrated in FIG. 5c, a first conductive liner 115 may be deposited prior to filling the contact hole with a first conductive material. The first conductive liner 115 is preferably conformal, and may comprise a single layer of Ta, TaN, WN, WSi, TiN, Ru and combinations thereof, as examples. The conductive liner is typically used as a barrier layer for preventing metal from diffusing into the underlying semiconductor and first insulating material layer 114 material. These liners are deposited, for example, using a chemical vapor deposition (CVD), plasma vapor deposition (PVD) or Atomic layer Deposition (ALD) process.

A first conductive material 116 is then deposited similarly using for example a CVD, PVD or ALD process over the first insulating material layer 114 to fill the contact hole. Excess portions of the first conductive material 116 are removed from the top surface of the first insulating material layer 114, e.g., using a chemical-mechanical polishing (CMP) process forming at least one contact plug or via 117.

The first conductive material 116 preferably comprise W, although copper, aluminum, Al—Cu—Si, other metals and combinations thereof may also be used. If the first conductive material 116 comprises W, preferably a bi-layer seed layer comprising CVD titanium nitride and silicon doped tungsten are used. In some embodiments, the contact plug is filled with copper, forgoing the titanium nitride liner (first conductive liner 115) which may be problematic in deeply scaled technologies.

Referring now to FIG. 5d, a second insulating layer 118 is then deposited over the first insulating layer 114. The second insulating layer 118 preferably comprises a low-k dielectric material having a dielectric constant of 3.6 or less, and may require heating, e.g., up to 400 degrees C. to remove solvents.

The second insulating layer 118 is patterned via lithography, e.g., with a mask. A photoresist is deposited over the second insulating layer 118, and portions of the photoresist are exposed, developed and removed, leaving a pattern for a metal line. The exposed second insulating layer 118 are removed to form openings 134 and 135 (see FIG. 4d) in the second insulating layer 118. Note, that the openings 134 and 135 are formed using a single common mask set and no additional mask levels are required.

The optional second conductive liner 136 is preferably deposited using a conformal deposition process, leaving a conformal liner or diffusion barrier 136 along the interior walls of opening 134 and 135. Preferably the conductive liner 136 comprises tantalum nitride deposited by plasma vapor deposition (PVD). Alternatively, the conductive liner 136 may comprise titanium nitride, tungsten nitride, a refractory metal or other barrier layers that may be conformally deposited, for example, using CVD, PVD processes or electro-less plating. The liner 136 may comprise a bi-layer of material, including, for example, a barrier layer and a conformal seed layer, which preferably comprises copper, aluminum, other metals or combinations thereof. The seed layer may be deposited using a CVD process, for example.

The remainder of the openings 134,135 is filled with second conductive material 138, for example, using an electro-plated fill process to create a first metal line (M1) having a portion residing within the second insulating layer 118 and a portion residing over the first insulating layer 114. In the preferred embodiment, the first metal line includes a control gate metal line 139 and a floating gate metal line 140. The second conductive material 138 preferably comprises copper, aluminum or other metals or combinations thereof. The second insulator layer between the openings separates the control gate metal line 139 and the floating gate metal line 140 and hence the capacitance between the two lines. Consequently, the patterning of this layer can be suitably modified to increase electrostatic coupling between the two metal lines.

The second conducting material 138 may be filled using either a single or multiple damascene process. In a single damascene process, a single layer of insulating material is patterned with a pattern for conductive features, such as conductive lines, conductive vias, or contacts, as example. In contrast in a dual damascene process, the vias and metals lines are patterned for conductive features and filled in a single fill step with a conductive material. Although preferred embodiments use a double damascene process, embodiments of the present invention may also be formed in single or multiple damascene processes. In multiple damascene process, three or more insulating material layers are patterned with patterns for conductive features and are later filled in a single fill step with a conductive material. Damascene processes are typically used when the conductive line material comprises copper, for example.

A third dielectric layer may be deposited over the second dielectric layer and first metal line to form a via level. For example, the third dielectric layer may be patterned and etched to create via holes. The via holes can be filled with a conductive liner followed by electroplating a conducting material such as copper to form vias 149 and 150. The device at this stage is shown in FIG. 5e.

Further levels of metal lines and vias (metallization) ML2, V2, ML3, V3, ML4, V4 etc. could proceed as discussed above by repeating the process for formation of metal lines 139 and 150, and vias 149 and 150. In some embodiments, the dimensions of the higher metal levels may be increased to reduce resistance of the metal lines.

Figure 7:
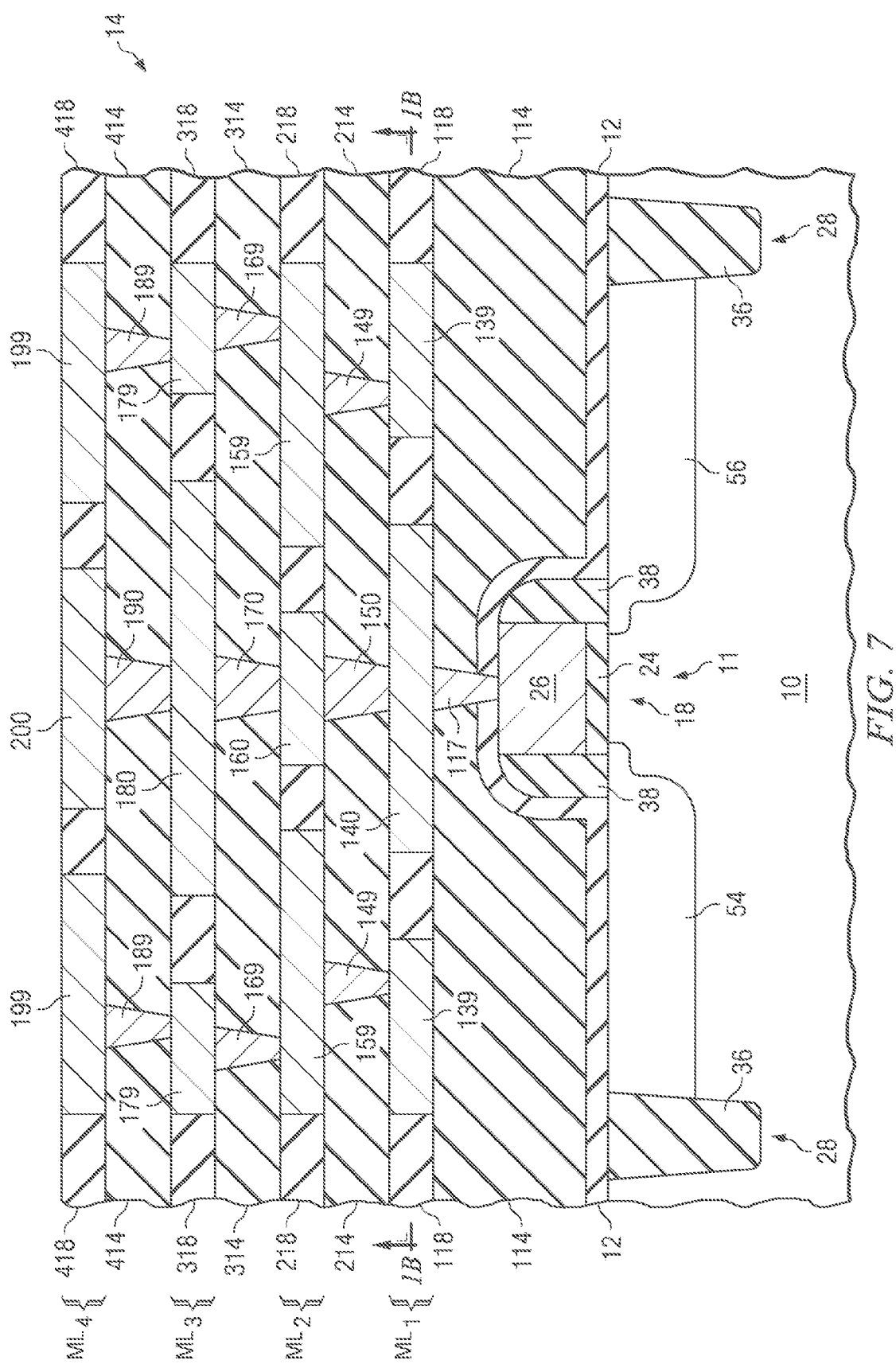
FIG. 7 illustrates the final device cross-sectional view of a device fabricated using a second embodiment process.

The method disclosed in the preferred embodiment describes the formation of memory devices without additional processing cost, as the process flow requires no additional mask or pattern levels. However, in other embodiments, new process steps may be specifically added in the fabrication of the memory device. For example, in some embodiments, the source drain extension may be blocked out from the memory regions of the wafer. Further, a different choice of conditions for source drain implants may be used for the memory device. FIG. 7 shows the final device structure formed with this embodiment and the flow chart of FIG. 8 shows the process used. As shown in flow chart of FIG. 8, the open or exposed regions are shown within brackets as either low voltage logic (LVL), high voltage logic (HVL), or floating gate memory (FGM).

Figure 9:
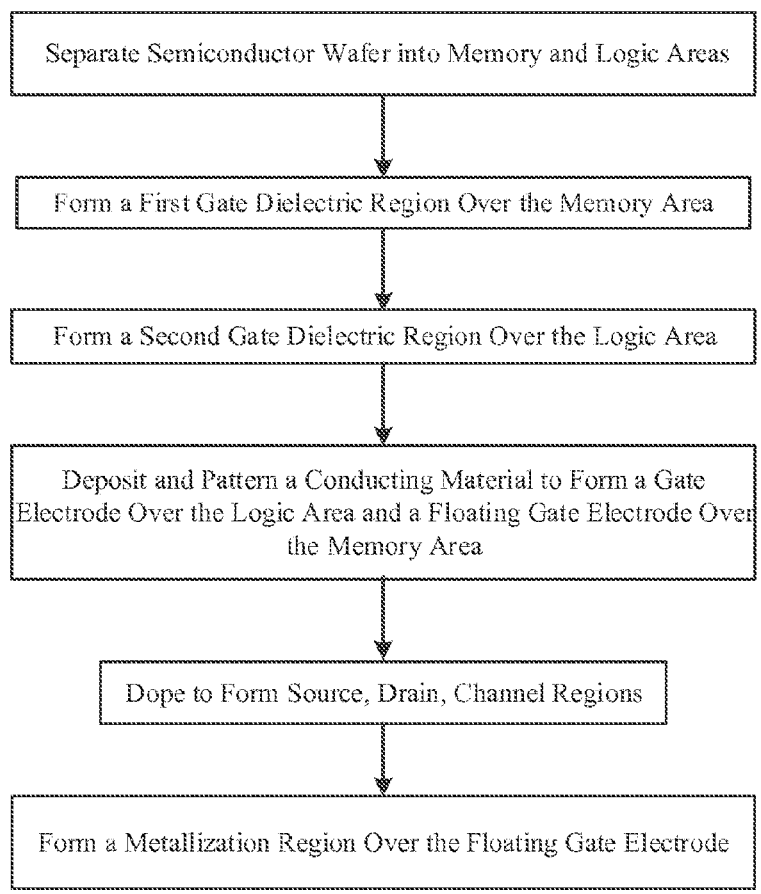
FIG. 9 illustrates a flow diagram of one implementation of the embodiment process of fabricating of the semiconductor device.

FIG. 9 illustrates a flow diagram of one implementation of the embodiment process of fabricating the semiconductor device.

It will be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of fabricating a semiconductor device, the method comprising:
   forming a channel region and a source region in a substrate, the source region and the channel region being formed along a first plane;
   forming a floating gate electrode disposed directly above the channel region; forming an inter-level dielectric layer surrounding the floating gate electrode;
   forming a first metal level overlying the substrate and overlying the floating gate electrode, the first metal level including a first metal feature electrically coupled to the floating gate electrode and a second metal feature coupled to a control gate node, wherein the first metal feature surrounds the second metal feature from all directions when viewed from a second plane, and wherein the second plane is parallel to the first plane, wherein the first metal feature overlaps with the channel region and the second metal feature overlaps with the source region; and
   forming a second metal level above the first metal level, the second metal level comprising a third metal feature electrically coupled to the floating gate electrode, and a fourth metal feature coupled to the control gate node, wherein the fourth metal feature surrounds the third metal feature from all directions when viewed from a third plane, and wherein the third plane is parallel to the first plane, wherein the fourth metal feature overlaps with the channel region and the third metal feature overlaps with the source region.

2. The method of claim 1, further comprising:
   at an outer surface of the first metal feature, a closest distance between an inner surface of the second metal feature to the outer surface of the first metal feature is substantially equal to the closest distance from the outer surface of the first metal feature to the inner surface of the second metal feature, wherein the closest distance is measured along a line perpendicular to the outer surface of the first metal feature, and
   at an outer surface of the fourth metal feature, a closest distance between an inner surface of the third metal feature to the outer surface of the fourth metal feature is substantially equal to the closest distance from the outer surface of the fourth metal feature to the inner surface of the third metal feature, wherein the closest distance is measured along a line perpendicular to the outer surface of the fourth metal feature.

3. The method of claim 1, wherein the semiconductor device is configured to be erased through carrier tunneling from the first metal feature to the second metal feature.

4. The method of claim 1, wherein the semiconductor device is configured to be erased through carrier tunneling from the floating gate electrode to the source region.

5. A method of fabricating a semiconductor wafer to form a memory area and a logic area, the memory area comprising nonvolatile memory devices employing floating gate transistors, the logic area comprising field effect transistors, the method comprising:
   separating the semiconductor wafer into a memory area and a logic area;
   forming a first gate dielectric region over the memory area; forming a second gate dielectric region over the logic area;
   depositing and patterning a conducting material, wherein the conducting material forms a gate electrode over the logic area and a floating gate electrode over the memory area;
   forming a channel region and a source region in the memory area, the source region and the channel region being formed along a first plane, wherein the floating gate electrode is disposed directly above the channel region;
   forming an inter-level dielectric layer surrounding the floating gate electrode;
   forming a first metal level overlying the semiconductor wafer and overlying the floating gate electrode, the first metal level including a first metal line electrically coupled to the floating gate electrode and a second metal line coupled to a control gate node, wherein the first metal line surrounds the second metal line from all directions when viewed from a second plane, and wherein the second plane is parallel to the first plane, wherein the first metal line overlaps with the channel region and the second metal line overlaps with the source region; and
   forming a second metal level above the first metal level, the second metal level comprising a third metal line electrically coupled to the floating gate electrode, and a fourth metal line coupled to the control gate node, wherein the fourth metal line surrounds the third metal line from all directions when viewed from a third plane, and wherein the third plane is parallel to the first plane, wherein the fourth metal line overlaps with the channel region and the third metal line overlaps with the source region.

6. The method of claim 5, wherein each of the floating gate transistors is configured to be erased through carrier tunneling from the first metal line to the second metal line.

7. The method of claim 5, wherein each of the floating gate transistors is configured to be erased through carrier tunneling from the floating gate electrode to the source region.

* * * * *